(12) United States Patent
Chinthakindi et al.

(10) Patent No.: US 7,397,087 B2
(45) Date of Patent: Jul. 8, 2008

(54) FEOL/MEOL METAL RESISTOR FOR HIGH END CMOS

(75) Inventors: Anil K. Chinthakindi, Fishkill, NY (US); Douglas D. Coolbaugh, Essex Junction, VT (US); Vidhya Ramachandran, Ossining, NY (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 304 days.

(21) Appl. No.: 10/710,847

(22) Filed: Aug. 6, 2004

(65) Prior Publication Data

US 2006/0027878 A1 Feb. 9, 2006

(51) Int. Cl.
*H01L 21/70* (2006.01)

(52) U.S. Cl. ............... 257/350; 257/358; 257/E21.703; 257/E27.112

(58) Field of Classification Search .................... 257/66, 257/288, E21.004, 347, 379, 380, 536, 538, 257/E21.006, E27.016; 438/382, 235, 238
See application file for complete search history.

(56) References Cited

U.S. PATENT DOCUMENTS

| | | | |
|---|---|---|---|
| 5,554,873 A * | 9/1996 | Erdeljac et al. ............. | 257/380 |
| 6,184,143 B1 | 2/2001 | Ohashi et al. | |
| 6,403,459 B1 | 6/2002 | Ohashi et al. | |
| 6,555,865 B2 * | 4/2003 | Lee et al. ..................... | 257/314 |
| 6,586,311 B2 * | 7/2003 | Wu ............................. | 438/382 |
| 6,645,821 B2 | 11/2003 | Bailey et al. | |
| 6,777,752 B2 * | 8/2004 | Osanai et al. ................ | 257/350 |
| 6,825,092 B2 * | 11/2004 | Zurcher et al. .............. | 438/384 |
| 6,924,181 B2 * | 8/2005 | Huang et al. ................. | 438/197 |
| 2001/0049199 A1 | 12/2001 | Steinmann et al. | |
| 2002/0055221 A1 * | 5/2002 | Kurokawa et al. .......... | 438/235 |
| 2003/0047782 A1 * | 3/2003 | Hasegawa et al. ........... | 257/347 |

FOREIGN PATENT DOCUMENTS

JP 2003-338549 11/2003

* cited by examiner

*Primary Examiner*—M. Wilczewski
*Assistant Examiner*—Tsz Chiu
(74) *Attorney, Agent, or Firm*—Scully, Scott, Murphy & Presser, P.C.; Richard Kotulak, Esq.

(57) ABSTRACT

A FEOL/MEOL metal resistor that has tight sheet resistance tolerance (on the order of about 5% or less), high current density (on the order of about 0.5 mA/micron or greater), lower parasitics than diffused resistors and lower TCR than standard BEOL metal resistors as well as various methods of integrating such a metal resistor structure into a CMOS technology are provided.

8 Claims, 7 Drawing Sheets

FEOL/MEOL METAL RESISTOR FOR HIGH END CMOS

BACKGROUND ART

The present invention relates to a metal resistor for use in semiconductor integrated circuits, and more particularly to methods of integrating a metal resistor such as, for example, a refractory metal nitride, into a complementary metal oxide semiconductor (CMOS) technology. The present invention also relates to a semiconductor structure that is formed utilizing the methods of the present invention.

BACKGROUND OF THE INVENTION

In semiconductor integrated circuits (ICs), a resistor may be used to control the resistance of other electronic components of the IC. As is known to those skilled in the art, the resistance, R, of a resistor is proportional to the length, L, of the resistor and the reciprocal cross sectional area, 1/A, of the resistor; the L and A are measured in the direction of current flow. The basic equation for resistance of a resistor is thus: R is proportional to L/A, i.e., R $\alpha$ L/A where R, L and A are as defined above.

Prior art resistors are typically composed of polysilicon that has been doped. As the integration of semiconductor devices increases, each component within a semiconductor IC has to provide equivalent or better electrical properties. A downscaled resistor thus has to provide a constant resistance value that does not fluctuate much during use. However, due to the properties of polysilicon, a prior art resistor comprised of doped polysilicon can only provide a limited resistance within a limited space. Employing a polysilicon resistor to provide relatively tighter resistance tolerances then becomes a problem in designing and fabricating a highly integrated semiconductor device.

Recently, doped polysilicon resistors have been replaced with a single thin film resistor that is comprised of a material that has a tighter resistance tolerance than that of polysilicon. Examples of such materials include, but are not limited to: TiN and TaN. Tantalum nitride, TaN, containing 36% $N_2$ is a material currently being used in the back-end-of-the line (BEOL) of most semiconductor devices. Even though tighter resistance materials can be used to fabricate good resistors, they typically exhibit a very high temperature coefficient of resistivity, i.e., TCR, that is on the order of about $-600$ ppm/$^\circ$ C. TCR, which is the normalized first derivative of resistance and temperature, provides an adequate means to measure the performance of a resistor.

On account of the high TCR values of prior art single thin film resistors, the resistance of such resistors tends to fluctuate alot when the resistor is used at normal operating temperatures of about 85$^\circ$ C.; resistance fluctuation hampers the performance of high-performance semiconductor IC devices. For example, if a resistor having a resistivity of 50 ohms is provided in a semiconductor IC, high TCR of the resistor may cause the resistance to vary as much as 15 to 20% from the desired resistance of 50 ohms as it is being used and heated up via Joule heating. As such, the 50-ohm resistor is not operating at the resistance value it was intended to operate at. Moreover, the self-heating of BEOL thin film resistors provides a resistor that has low current density.

Front-end-of-the-line (FEOL) diffusion resistors have allowed higher current density and have achieved low tolerances (on the order of about 10%), but these types of resistors have high parasitic capacitance since they are built within the substrate. Additionally, FEOL diffusion resistors have very high TCR.

Polysilicon resistors can be used at slightly higher current density (2x) than BEOL metal resistors and they have low TCR values and parasitics (when placed atop a trench isolation region). Despite these advantages, polysilicon resistors tend to have higher sheet resistance tolerances than the other resistors.

None of the prior art resistors mentioned above have all the figure of merits, e.g., tight sheet resistance tolerance, high current density and low parasitics, that are necessary for current semiconductor ICs. Hence, there is a need for providing a resistor for use in semiconductor ICs that has tight sheet resistance tolerance, high current density and low parasitics.

SUMMARY OF THE INVENTION

The present invention provides a FEOL/MEOL (middle-end-of-the-line) metal resistor that has tight sheet resistance tolerance (on the order of about 5% or less), high current density (on the order of about 0.5 mA/micron or greater), low parasitics than existing diffused resistors, and a decrease in TCR versus BEOL metal resistors (60%).

Specifically, the present invention provides a semiconductor IC structure which comprises:
  a semiconductor substrate including at least one front-end-of-the-line device (FEOL) located on a surface thereof;
  at least one resistor located on, or in close proximity to, said surface of said semiconductor substrate, said at least one resistor comprising at least a conductive metal; and
  a first level of metallization above said at least one resistor.

In addition to the semiconductor IC structure mentioned above, the present invention also provides various methods of manufacturing the same. Specifically, the methods of the present invention provide a means for integrating a metal resistor into a CMOS technology. In broad terms, the methods of the present invention comprise:
  forming at least one FEOL device on a surface of a semiconductor substrate;
  forming at least one resistor on, or in close proximity to, the surface of said semiconductor substrate, said at least one resistor comprising a conductive metal; and
  forming a first level of metallization over said semiconductor structure.

In one embodiment of the method of the present invention, the processing includes the steps of:
  providing a structure including at least one FEOL device located on a surface of a semiconductor substrate;
  forming an etch stop layer over said structure including said at least one FEOL device;
  forming a conductive metal on said etch stop layer;
  forming a dielectric material on said conductive metal;
  patterning said conductive metal and said dielectric material to provide a stack including said conductive metal and said dielectric material; and
  forming a first level of metallization over said at least one FEOL device and said stack.

Another method of the present invention includes the steps of:
  providing a structure including a planarized dielectric material located on a surface of a semiconductor substrate that comprises at least one FEOL device located thereon;
  forming a conductive metal on said planarized dielectric material;
  forming a dielectric material on said conductive metal;

patterning said conductive metal and said dielectric material to provide a stack; and forming a first level of metallization over at least said stack, said planarized dielectric and said at least one FEOL device.

A yet other method of the present invention includes the steps of:

providing a structure including at least one FEOL device located on a surface of a semiconductor substrate;

forming a silicide metal layer over said structure;

forming a dielectric material over said silicide metal layer;

patterning said dielectric material to provide at least one stack of a patterned dielectric material atop a portion of said silicide metal layer, said at least one stack is located atop said surface of said semiconductor substrate;

siliciding to convert at least the silicide metal layer of said at least one stack into a metal silicide, wherein said metal silicide of said stack comprises a conductor of a resistor; and forming a first level of metallization over at least said stack and said at least one FEOL device.

DISCLOSURE OF INVENTION

Figure 1A:
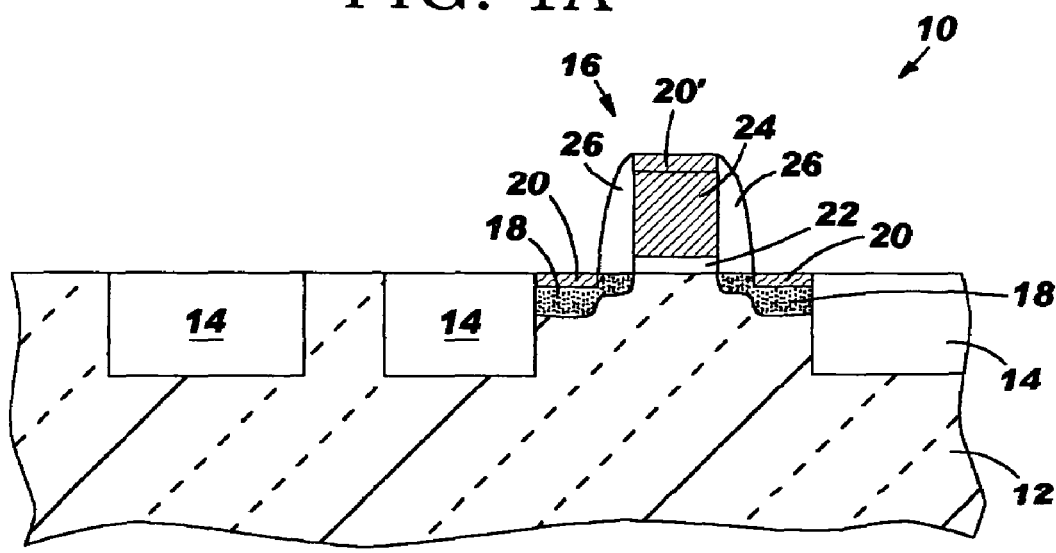
FIGS. 1A-1F are pictorial representations (through cross sectional views) illustrating the basic processing steps employed in a first embodiment of the present invention.

The present invention, which provides a semiconductor IC structure including a metal resistor on, or in close proximity to, a surface of a semiconductor substrate including at least one FEOL device and methods of fabricating the same, will now be described in greater detail by referring to the drawings that accompany the present application. The drawings are provided for illustrative purposes and are thus not drawn to scale. It is observed that in the drawings that accompany the present application, like elements and/or components are referred to by like reference numerals.

As stated above, the present invention provides a FEOL/MEOL metal resistor that has tight sheet resistance tolerance (on the order of about 5% or less), high current density (on the order of about 0.5 mA/micron or greater), low parasitics, and reduced TCR. The metal resistor is integrated into a CMOS technology such that it is located on, or in close proximity to, a surface of a semiconductor substrate. By "close proximity", it is meant within a distance that is below the first metal interconnect level. In some embodiments, which are illustrated in the present drawings, the metal resistor is located over a trench isolation region. Although this arrangement is depicted and described, the present invention also contemplates embodiments in which the metal resistor is located above a semiconductor surface that contains no trench isolation region.

First Embodiment

Reference is first made to the embodiment depicted in FIGS. 1A-1F. This embodiment begins with providing the structure 10 shown in FIG. 1A. The structure 10 includes a processed semiconductor substrate 12 that includes at least one trench isolation region 14 located in the semiconductor substrate 12 and at least one FEOL device 16 located on a surface of the semiconductor substrate 12. In the drawing, the at least one FEOL device 16 is a field effect transistor (FET) which includes source/drain regions 18, silicide regions 20 located atop the source/drain regions 18, gate dielectric 22, gate conductor 24, optional silicide region 20' located above the gate conductor 24 and at least one spacer 26 located on a sidewall of at least the gate conductor 24. Despite illustrating a FET as the FEOL device, the present invention also contemplates other types of FEOL devices including, for example, bipolar transistors, BiCMOS devices, passive devices and any other like devices that are formed at the front end of the processing. Combinations of such FEOL devices are also contemplated.

The processed semiconductor substrate 12 comprises any semiconductor material including, for example, Si, SiGe, SiGeC, SiC, GaAs, InP, InAs, silicon-on-insulators (SOIs), SiGe-on-insulators (SGOIs), and layered semiconductors such as Si/SiGe. Preferably, the processed semiconductor substrate 12 comprises a Si-containing semiconductor material.

The gate dielectric 22 includes any insulating material such as an oxide, nitride, oxynitride or a stack thereof. Preferably, the gate dielectric 22 is an oxide such as $SiO_2$, $TiO_2$, $Al_2O_3$ and the like. The gate conductor 24 includes any conductive material including doped polysilicon, metals, metal silicides, metal nitrides and combinations thereof.

The trench isolation region 14, when present, comprises a trench dielectric material such, for example, tetraethyorthosilicate (TEOS) or a high-density plasma oxide (HDPO).

The at least one FEOL device 16 is formed utilizing conventional techniques that are well known to those skilled in the art. For example, when the at least one FEOL device 16 is a FET, conventional CMOS processing steps that are capable of forming a FET can be used. When a bipolar transistor is used, conventional bipolar transistor processing steps can be used. Also, when a BiCMOS is used conventional bipolar and CMOS processing steps can be used.

The details of the various processing steps used in forming the FEOL device 16 are not critical to the present invention since the present invention can use any technique that is presently available or can be developed in the future for making FEOL devices.

Figure 1B:
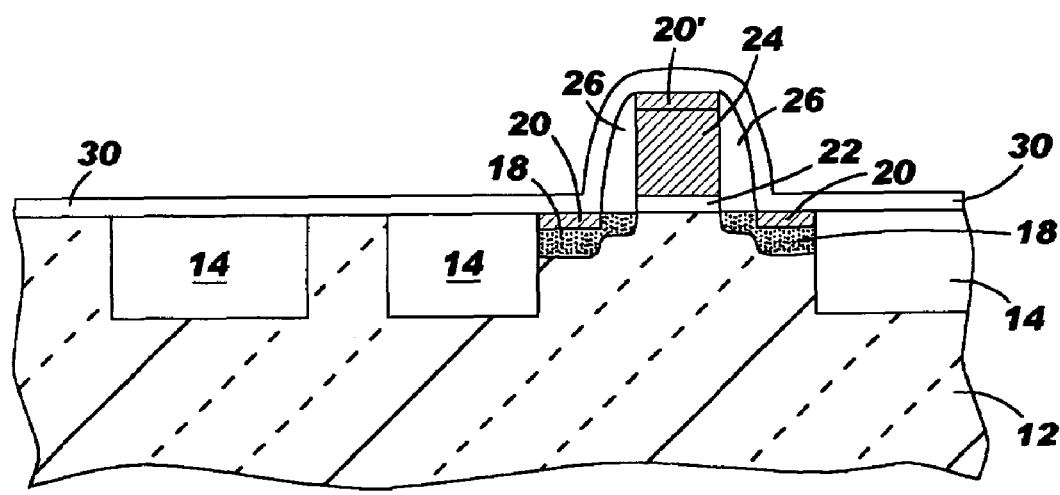

After providing the structure 10 shown in FIG. 1A, an etch stop layer 30 is formed over the entire structure including atop the trench isolation region 14 and the at least one FEOL device 16. The resultant structure is shown in FIG. 1B.

The etch stop layer 30 is formed utilizing any conformal deposition process including, for example, chemical vapor deposition (CVD), plasma enhanced chemical vapor deposition (PECVD), chemical solution deposition, evaporation, atomic layer deposition (ALD) and other like deposition processes. The thickness of the etch stop layer 30 formed may vary depending on the deposition process used as well as the type of insulating material employed. Typically, and for illustrative purposes, the etch stop layer 30 has a thickness from about 20 to about 50 nm, with a thickness from about 30 to about 40 nm being more typical.

Etch stop layer 30 may comprise any insulating material that can serve as a layer in which an etching process can be stopped on. Illustratively, the etch stop layer 30 may comprise an oxide, nitride, oxynitride or any combination thereof. In a preferred embodiment, the etch stop layer 30 is comprised of SiN or Si oxynitride.

Figure 1C:
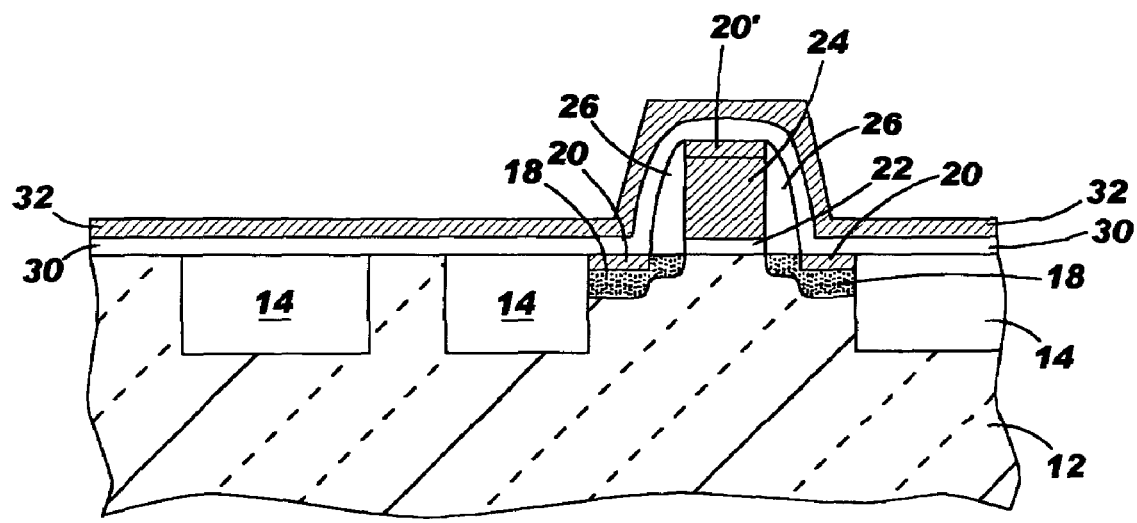

Next, and as shown in FIG. 1C, a conductive metal 32 is formed on a surface of the etch stop layer 30. The conductive metal 32 may comprise any metal that has a tighter resistance tolerance than polysilicon. Examples of materials that can be used as the conductive metal 32 include, but are not limited to: Ta, TaN, Ti, TiN, W, WN, NiCr, SiCr and the like. Combinations of these materials are also contemplated herein. Preferably, the conductive metal 32 comprises TaN, TiN, NiCr or SiCr, with TaN and TiN being particularly preferably. The conductive metal 32 is a thin layer whose thickness is typically from about 20 to about 50 nm, with a thickness from about 30 to about 40 nm being more typical.

The conductive metal 32 can be formed on the etch stop layer 30 utilizing any deposition process including, for example, CVD, PECVD, sputtering, plating, evaporation, ALD and other like deposition processes.

Figure 1D:
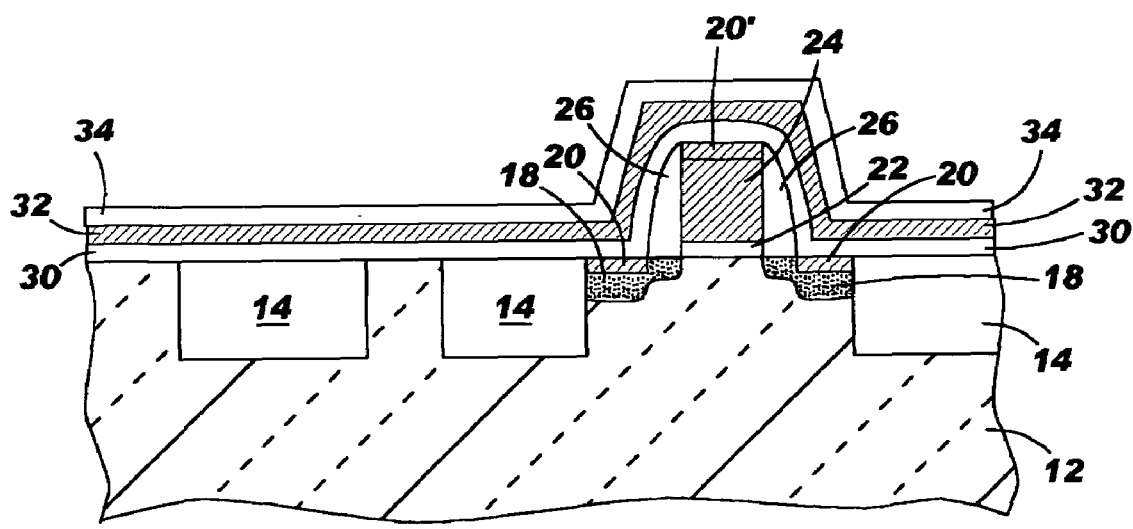

After forming the conductive metal 32, a dielectric material 34 is formed on the conductive metal 32 providing the structure shown, for example, in FIG. 1D. The dielectric material 34 formed at this point of the present invention may comprise an oxide, nitride, oxynitride or any combination thereof. The dielectric material 34 can be the same or a different insulating material as the etch stop layer 30. In one embodiment, the etch stop layer 30 and the dielectric material 34 are both composed of SiN.

The dielectric material 34 formed at this point of the present invention can have a variable thickness depending on the technique used in forming the same as well as the type of insulating material employed. Typically, the dielectric material 34 has a thickness from about 30 to about 60 nm, with a thickness from about 40 to about 50 nm being more typical. The dielectric material 34 is formed utilizing a conventional deposition process which may be the same or different from the deposition process used in forming the etch stop layer 30. Thus, CVD, PECVD, evaporation, ALD, or chemical solution deposition may be used in forming the dielectric material 34.

Figure 1E:
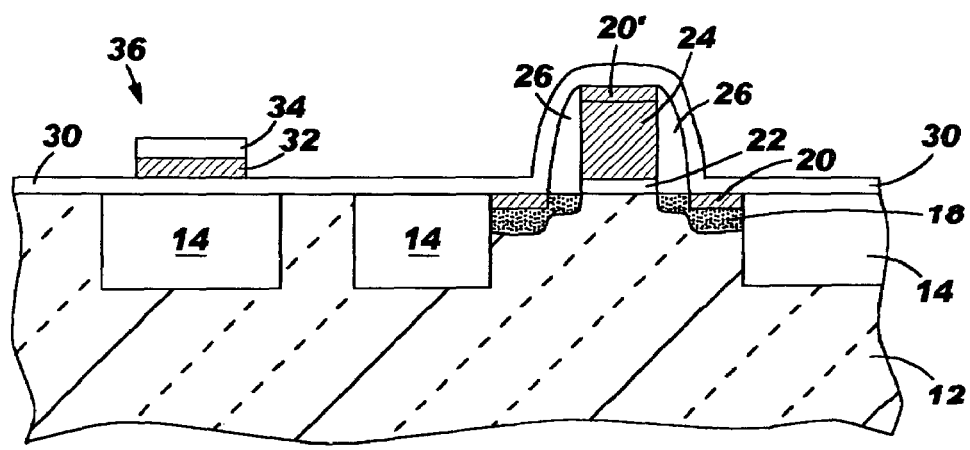

A stack 36 comprising a patterned dielectric material 34 and a patterned conductive metal 32 is next provided as shown, for example, in FIG. 1E. Stack 36 includes the FEOL/MEOL metal resistor (i.e., conductive metal 32) of the present invention. As shown, the patterned conductive metal 32 is located in close proximity to the surface of the processed semiconductor substrate 12, separated only by the etch stop layer 30. In the embodiment shown, the stack 36 including the patterned conductive metal 32 is formed above the trench isolation region 14. In some embodiments, the stack 36 is located above semiconducting material.

The stack 36 is formed by lithography and etching. The lithography step includes applying a photoresist (not shown) atop the surface of the dielectric material 34, exposing the photoresist to a pattern of radiation and developing the pattern into the photoresist utilizing a conventional resist developer. The etching step comprises any conventional dry etch process, wet etch process or a combination thereof that is capable of selectively removing unprotected portions of the dielectric material 34 and the underlying conductive metal 32, while stopping on the etch stop layer 30.

Examples of dry etching processes that can be employed include reactive ion etching (RIE), plasma etching, ion beam etching or laser ablation. When a wet etch process is employed, a timed etch is typically used and the etchant must be capable of removing the unprotected portions of the dielectric material 34 and the corresponding underlying conductive metal 32.

Figure 1F:
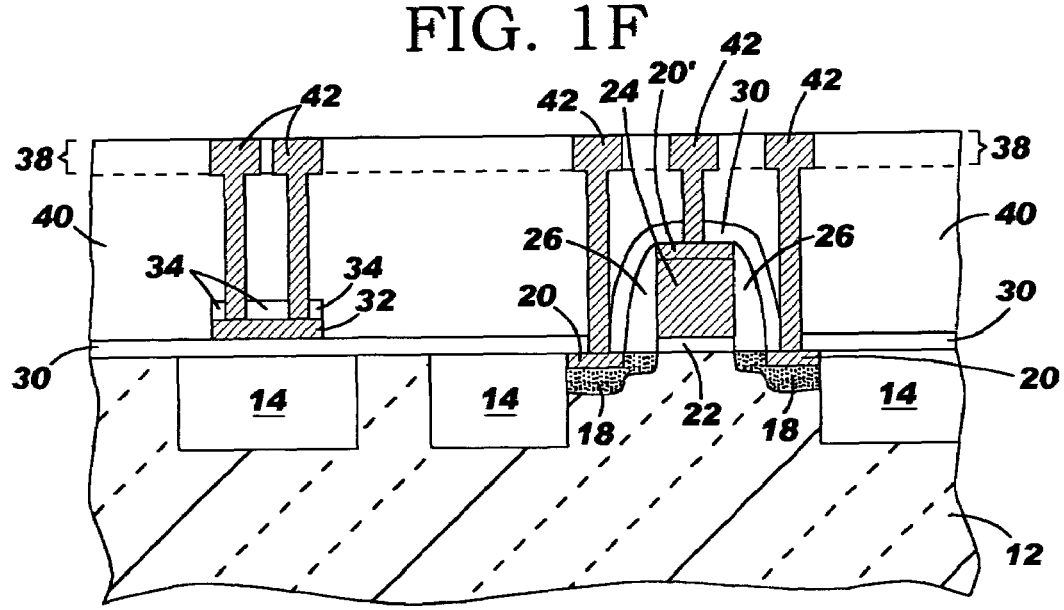

After forming the stack 36, at least one level of metallization (i.e., a first level of metallization 38) is formed by conventional BEOL processing. This includes forming an interlevel dielectric (ILD) 40 via deposition, forming contact openings in the interlevel dielectric 40 and filling the contact openings with a conductive metal 42. The resultant structure is shown in FIG. 1F. The ILD 40 includes any conventional organic (polyimide, polyamide, silicon-containing polymers, etc.) or inorganic dielectric material (such as boron phosphorus doped silicate glass (BPSG) or $SiO_2$) that is typically employed in interconnect structures. The ILD 40 can be porous or non-porous and it can be formed utilizing any known deposition process including CVD, PECVD, chemical solution deposition, spin-on coating, evaporation and the like. The ILD 40 typically has a thickness from about 400 to about 600 nm.

The conductive metal 42 includes any conductive wiring material that is typically used in an interconnect structure. Thus, for example, the conductive metal 42 can comprise Cu, Al, Ta, TaN, W or alloys and silicides thereof. The conductive metal 42 is formed via a deposition process such as sputtering, plating, CVD, PECVD, evaporation and the like.

The contact openings, which include vias and lines, are formed via lithography and etching. As known to those skilled in the art, vias have a narrower width than lines. In the drawings, the vias extend through ILD 40 and the lines are located atop said vias.

Second Embodiment

Figure 2A:
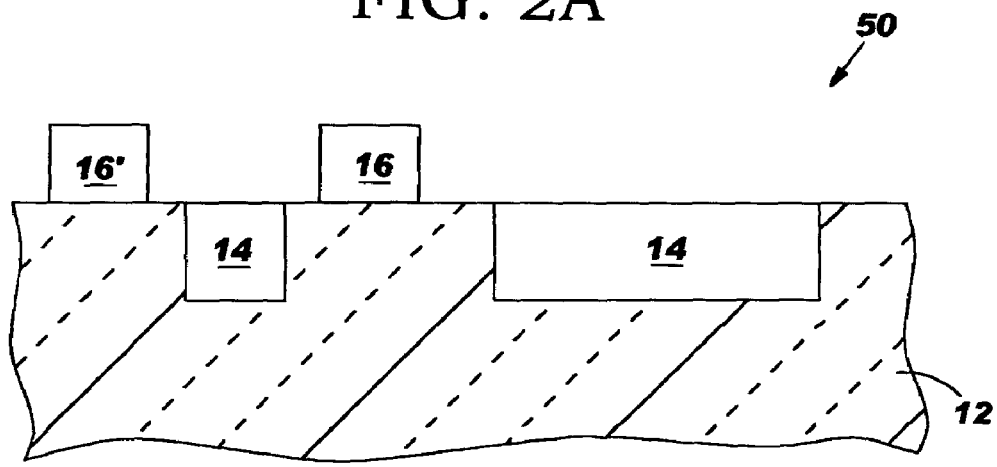
FIGS. 2A-2F are pictorial representations (through cross sectional views) illustrating the basic processing steps employed in a second embodiment of the present invention.

Reference is made to the structure 50 shown in FIG. 2A which includes semiconductor substrate 12, trench isolation regions 14 and FEOL devices 16 and 16'. FEOL device 16 is a FET, while FEOL device 16' is a bipolar device. For clarity, the FEOL devices 16 and 16' are shown as a single box in the drawings of the present invention. The structure shown in FIG. 2A is made using the techniques described in the first embodiment with respect to FIG. 1A.

Figure 2B:
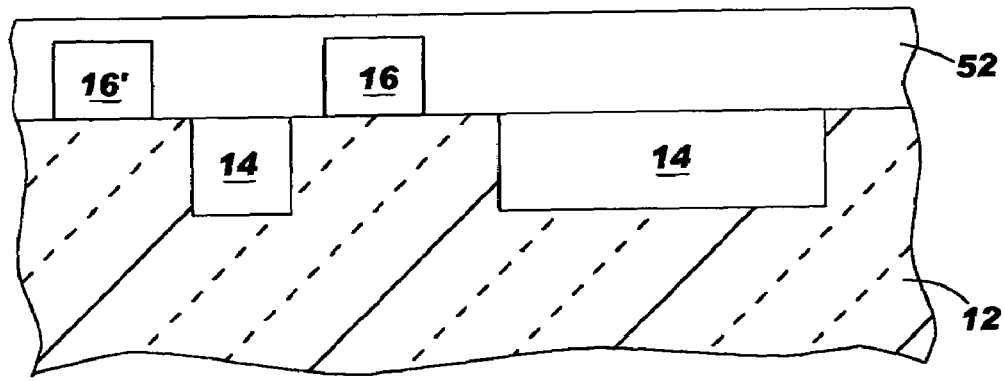

Next, a planarized dielectric material 52, which can be an oxide such as boron doped silicate glass or another like ILD material (see the first embodiment above) is formed. The planarized dielectric material 52 is formed by a conventional deposition process and, if needed, a planarization process such as chemical mechanical polishing (CMP) or grinding can be employed. The resultant structure including the planarized dielectric material 52 is shown in FIG. 2B. The planarized dielectric material 52 has a thickness that is slightly greater than the height of the FEOL devices, 16 and 16'. Specifically, the planarized dielectric material 52 has a thickness from about 400 to about 760 nm, with a thickness from about 450 to about 550 nm being more typical.

Figure 2C:
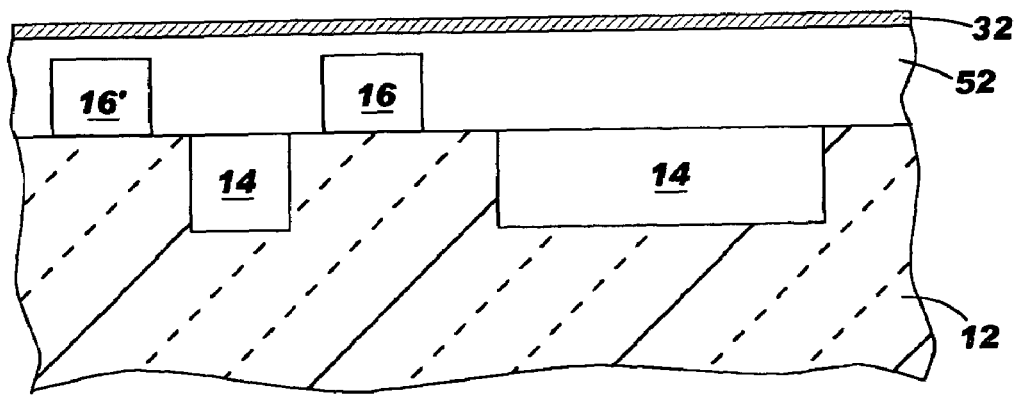

A conductive metal 32 is then formed on a surface of the planarized dielectric material 52 providing the structure shown in FIG. 2C. The details concerning the conductive metal 32 used in the second embodiment are the same as those discussed in the first embodiment, thus those details are incorporated herein by reference.

Figure 2D:
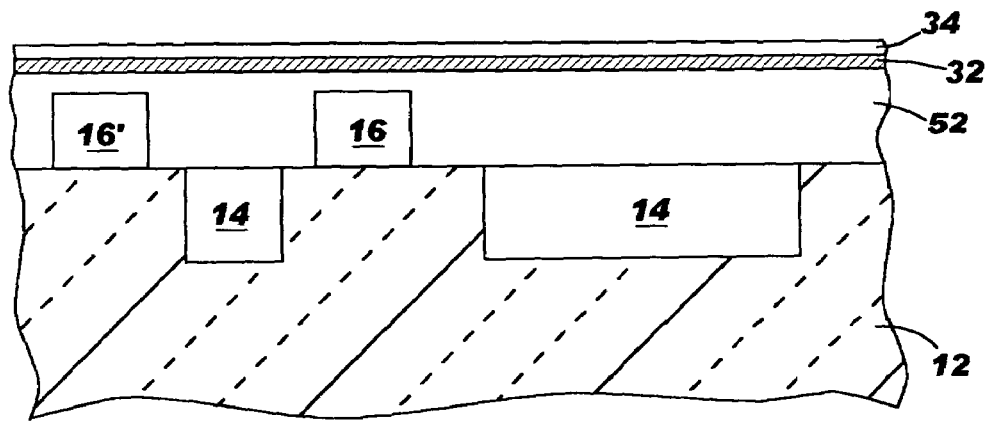

After forming the conductive metal 32 on the structure, a dielectric material 34 is formed on the conductive metal 32 providing the structure shown in FIG. 2D. The details concerning the dielectric material 34 used in the second embodiment are the same as those discussed in the first embodiment, thus those details are incorporated herein by reference.

Figure 2E:
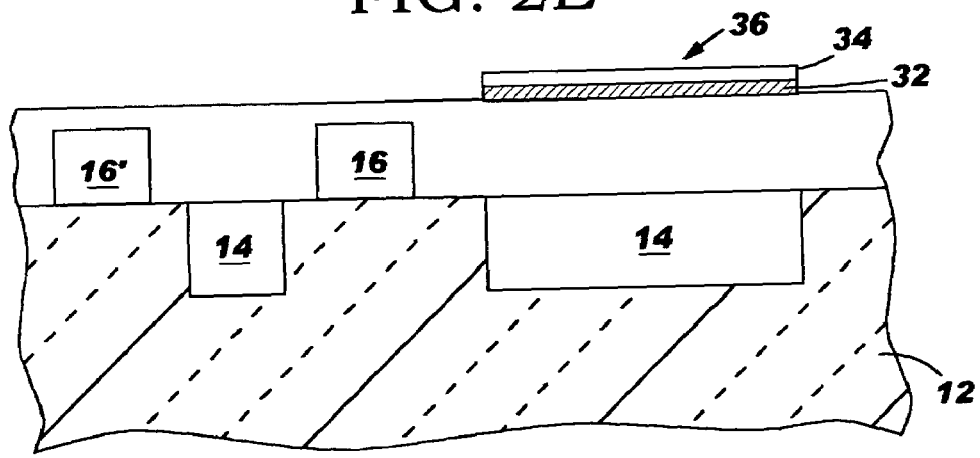
Figure 2F:
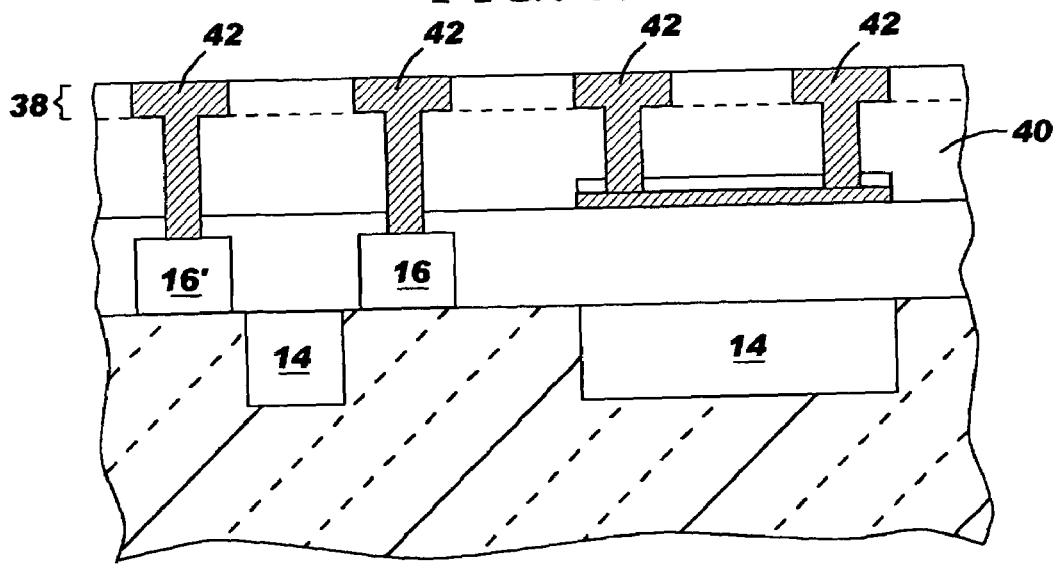

Next, stack 36 is formed providing the structure shown in FIG. 2E. The stack 36 is formed as described above in the first embodiment. Thus, those processing details are incorporated herein by reference as well.

The structure shown in FIG. 2E is then subjected to BEOL processing which is capable of forming the first level of metallization 38 thereon. The BEOL processing includes forming ILD 40 and providing contact openings that are filled with conductive metal 42. The details concerning this step of the second embodiment of the present invention are the same as described above.

Third Embodiment

Figure 3A:
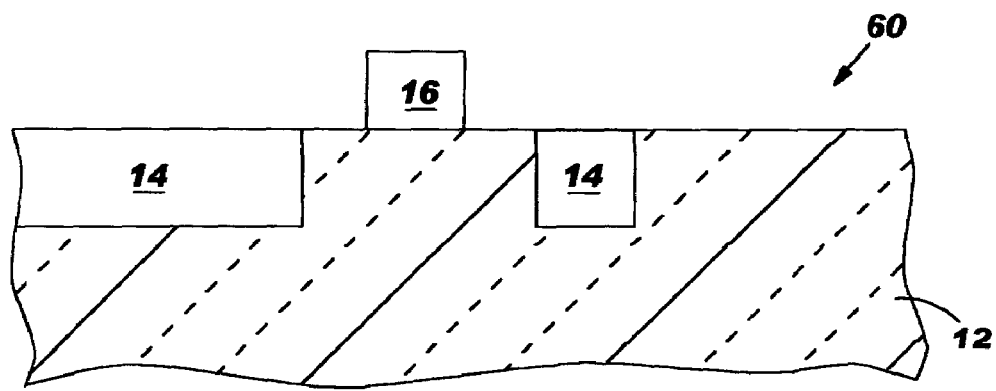
FIGS. 3A-3F are pictorial representations (through cross sectional views) illustrating the basic processing steps employed in a third embodiment of the present invention.

This embodiment is different from the embodiments described above in that the resistor includes a metal silicide, which is formed during silicidation of the FEOL devices. The third embodiment of the present invention begins with providing the structure 60 shown in FIG. 3A. This structure includes at least one FEOL device 16 located on a surface of the semiconductor substrate 12, which includes at least one trench isolation region 14. The FEOL device 16 shown and exemplified is a FET that does not yet contain any silicide regions. Although, an FET device is shown, the third embodiment can work with other FEOL devices that include silicide regions.

Figure 3B:
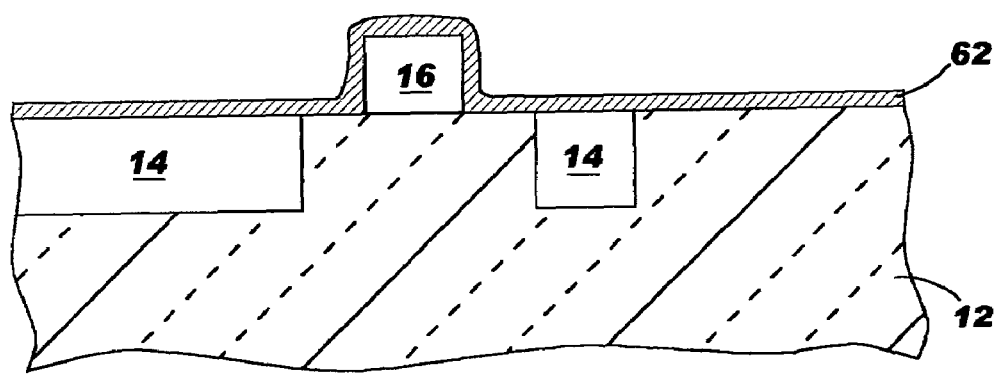

A silicide metal layer 62 is then formed over the structure providing the structure shown in FIG. 3B. The silicide metal 62 used in this embodiment of the present invention comprises any metal that is capable of reacting with silicon to form a metal silicide. Examples of such metals include, but are not limited to: Ti, Ta, W, Co, Ni, Pt, Pd and alloys thereof. The silicide metal layer 62 used in the present invention may be deposited using any conventional deposition process including, for example, sputtering, chemical vapor deposition, evaporation, chemical solution deposition, plating and the like. The thickness of the silicide metal layer 62 may vary, but typically the silicide metal layer 62 has a thickness from about 10 to about 50 nm.

Figure 3C:
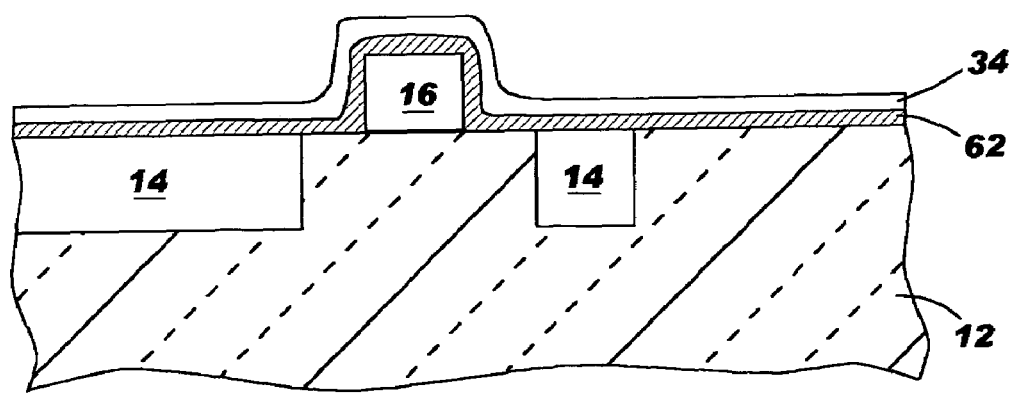

Next, a dielectric material 34 is formed on the silicide metal layer 62 utilizing the techniques described above in the first embodiment of the present invention. The structure including the dielectric material 34 is shown, for example, in FIG. 3C.

Figure 3D:
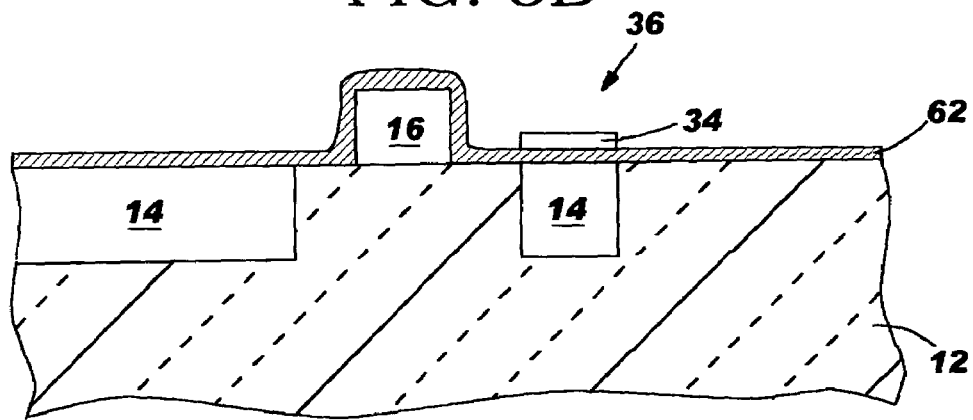

The dielectric material 34 is then patterned via lithography and etching to provide at least one stack 36 of a patterned dielectric material 34 over a portion of the silicide metal layer 62. As shown, the at least one stack 36 is located on a surface of the semiconductor substrate 12. The silicide metal 62 within stack 36 will become the metal resistor of the present invention, while remaining portions of the silicide metal layer 62 not underneath the patterned dielectric material which are located atop silicon will become the silicide regions 20 located atop the source/drain regions 18, and the silicide region 20' that is located atop the gate conductor 24. See FIG. 3D.

Next, the structure is annealed to convert the silicide metal layer 62 of each stack into a metal silicide. The annealing includes a first anneal, a selective etching process and optionally a second anneal. The first anneal is typically performed at lower temperatures than the second annealing step. Typically, the first annealing step, which may, or may not, form a high resistance silicide phase material, is performed at a temperature from about 300° to about 600° C. using a continuous heating regime or various ramp and soak heating cycles. More preferably, the first annealing step is performed at a temperature from about 350° to about 550° C. The second annealing step is performed at a temperature from about 600° C. to about 800° C. using a continuous heating regime or various ramp and soak heating cycles. More preferably, the second annealing step is performed at a temperature from about 650° C. to about 750° C. The second anneal typically converts the high resistance silicide into a silicide phase of lower resistance.

The salicide anneals are carried out in a gas atmosphere, e.g., He, Ar, $N_2$ or forming gas. The source/drain silicide contact annealing steps may use different atmospheres or the annealing steps may be carried out in the same atmosphere. For example, He may be used in both annealing steps, or He can be used in the first annealing step and a forming gas may be used in the second annealing step.

Figure 3E:
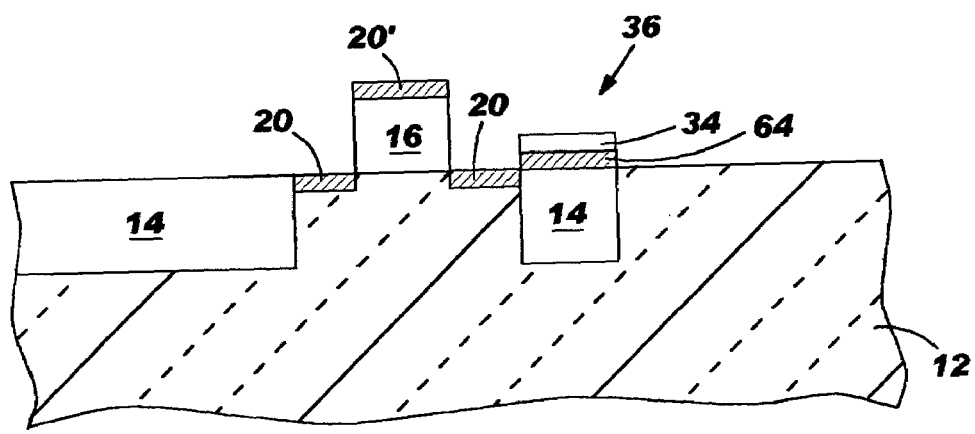

The selective etch which occurs after the first anneal comprises a wet etch process that is capable of removing any exposed non-reactive silicide metal from the structure. FIG. 3E shows the structure after the silicide anneal and selective etch. In this embodiment, the patterned dielectric material 34 serves an etch mask. In this drawing, silicide region 64 is the metal resistor of the present invention. The patterned dielectric material 34 can be removed after the selective etch, but it is not necessary.

Figure 3F:
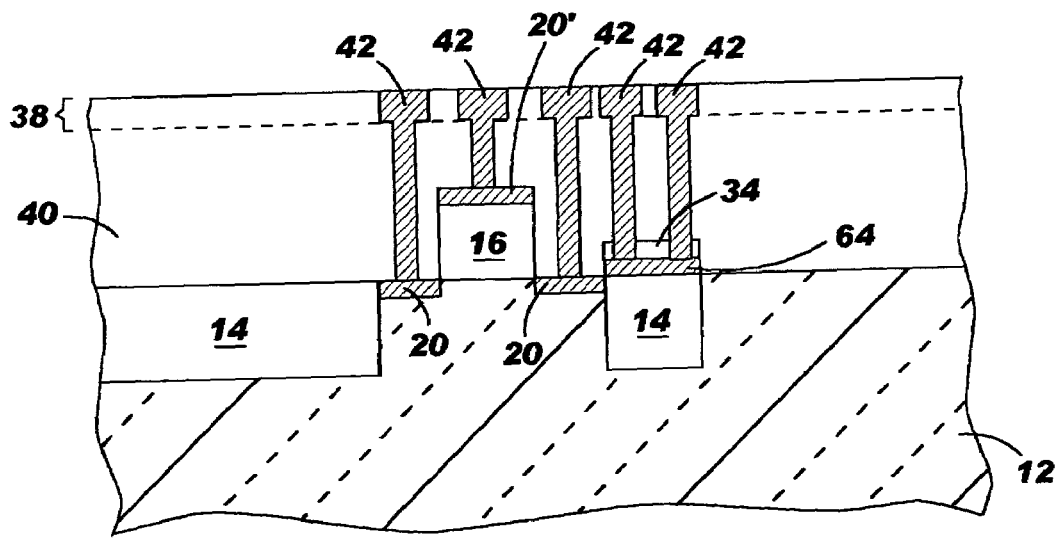

Next, a first level of metallization 38 is formed over the structure shown in FIG. 3E providing the structure shown in FIG. 3F. The details concerning this step of the present invention are the same as those described above in the first embodiment of the present invention.

It is observed that the various embodiments of the present invention provide means for integrating a metal resistor over the semiconductor substrate, yet below the first level of metallization. Thus, the integration schemes of the present invention provide better thermal dissipation thru the substrate as compared with prior art metal resistor designs.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

The invention claimed is:

1. A semiconductor IC structure comprising:
   a semiconductor substrate;
   a shallow trench isolation region located in said semiconductor substrate;
   at least one front-end-of-the-line (FEOL) device located on a surface of said semiconductor substrate;
   an etch stop layer located directly on said shallow trench isolation region;
   a metal resistor comprising at least a conductive metal and located directly on and above said etch stop layer;
   a dielectric material portion located directly on and above said metal resistor, wherein first sidewalls of said metal resistor and second sidewalls of said dielectric material portion are vertically coincident and said first sidewalls are directly adjoined to and located directly above said second sidewalls; and
   a first level of metallization located above said metal resistor.

2. The semiconductor IC structure of claim 1 wherein said conductive metal comprises Ta, TaN, Ti, TiN, W, WN, NiCr, SiCr or a metal silicide.

3. The semiconductor IC structure of claim 2 wherein said conductive metal comprises TiN, TaN, NiCr or SiCr.

4. The semiconductor IC structure of claim 1 wherein said conductive metal has a thickness from about 20 to about 50 mm.

5. The semiconductor IC structure of claim 1 wherein said etch stop layer has a thickness from about 20 to about 50 nm.

6. The semiconductor IC structure of claim 1 wherein said first level of metallization comprises an interlevel dielectric material having contact openings that are filled with a conductive material.

7. The semiconductor IC structure of claim 1 wherein said at least one FEOL device comprises a field effect transistor, a bipolar transistor, a BiCMOS device, or a passive device.

8. The semiconductor IC structure of claim 1 wherein a periphery of a first cross-sectional area enclosed by said first sidewalk of said metal resistor and a periphery of a second horizontal cross-sectional area enclosed by said second sidewalls of said dielectric material portion are congruent.

* * * * *